(12) United States Patent
Gambardella et al.

(10) Patent No.: US 6,937,029 B2
(45) Date of Patent: Aug. 30, 2005

(54) METHOD FOR DETECTION OF A SHIELDING FAULT IN A MULTIWIRE CABLE

(75) Inventors: Eddie Gambardella, Blagnac (FR); Franck Flourens, Toulouse (FR)

(73) Assignee: Airbus France, Toulouse (FR)

( * ) Notice: Subject to any disclaimer, the term of this patent is extended or adjusted under 35 U.S.C. 154(b) by 86 days.

(21) Appl. No.: 10/682,116

(22) Filed: Oct. 8, 2003

(65) Prior Publication Data

US 2004/0070406 A1 Apr. 15, 2004

(30) Foreign Application Priority Data

Oct. 11, 2002 (FR) .............................................. 02 12671

(51) Int. Cl.$^7$ ........................ G01R 27/28; G01R 31/02
(52) U.S. Cl. ...................................... 324/627; 324/539
(58) Field of Search ............................... 324/627, 127, 324/612, 600, 522–528, 529–533, 628; 336/175; 370/245, 503, 248, 249; 379/27.01, 27.03, 93.01, 93.08; 348/192; 714/776

(56) References Cited

U.S. PATENT DOCUMENTS

| | | | |
|---|---|---|---|
| 3,711,767 A | | 1/1973 | Campbell, Jr. et al. |
| 3,792,350 A | * | 2/1974 | Bossler et al. ............... 324/530 |
| 3,990,003 A | * | 11/1976 | Agee, Jr. et al. ............. 324/531 |
| 4,260,566 A | * | 4/1981 | Brouwer et al. ............. 264/408 |
| 4,325,022 A | * | 4/1982 | Pelletier ...................... 324/533 |
| 4,387,336 A | * | 6/1983 | Joy et al. ..................... 324/515 |
| 4,541,092 A | * | 9/1985 | Sako et al. .................. 714/756 |
| 5,629,628 A | * | 5/1997 | Hinds et al. ................. 324/628 |
| 5,886,531 A | * | 3/1999 | Delcourt et al. ............ 324/627 |
| 6,002,671 A | | 12/1999 | Kahkoska et al. |
| 6,281,685 B1 | * | 8/2001 | Tuttle ......................... 324/529 |

FOREIGN PATENT DOCUMENTS

SU 1 278 737 A1 12/1986

OTHER PUBLICATIONS

French Preliminary Search Report, FR 0212671, French filing date Oct. 11, 2002, date Search Report mailed–Jul. 4, 2003.

* cited by examiner

*Primary Examiner*—Anjan Deb
*Assistant Examiner*—Hoai-An D. Nguyen
(74) *Attorney, Agent, or Firm*—Thelen Reid & Priest, LLP

(57) ABSTRACT

This invention relates to a method for detection of a shielding fault in a multiwire cable forming part of a communication network, during functional operation of the said network, the said cable (10) transferring a multiframe signal S(t), which comprises the following steps:

a disturbing signal I(t) is injected into the said cable through an injection clamp (14) for a determined time T, when an item of equipment (12) receives the signal S(t), the number N of frames in fault during the injection period of the disturbing signal I(t) is counted, it is decided that there is a shielding fault in this cable if $N/T \leq TEP_{max}$, where $TEP_{max}$ is the maximum packet error rate to be guaranteed.

8 Claims, 2 Drawing Sheets

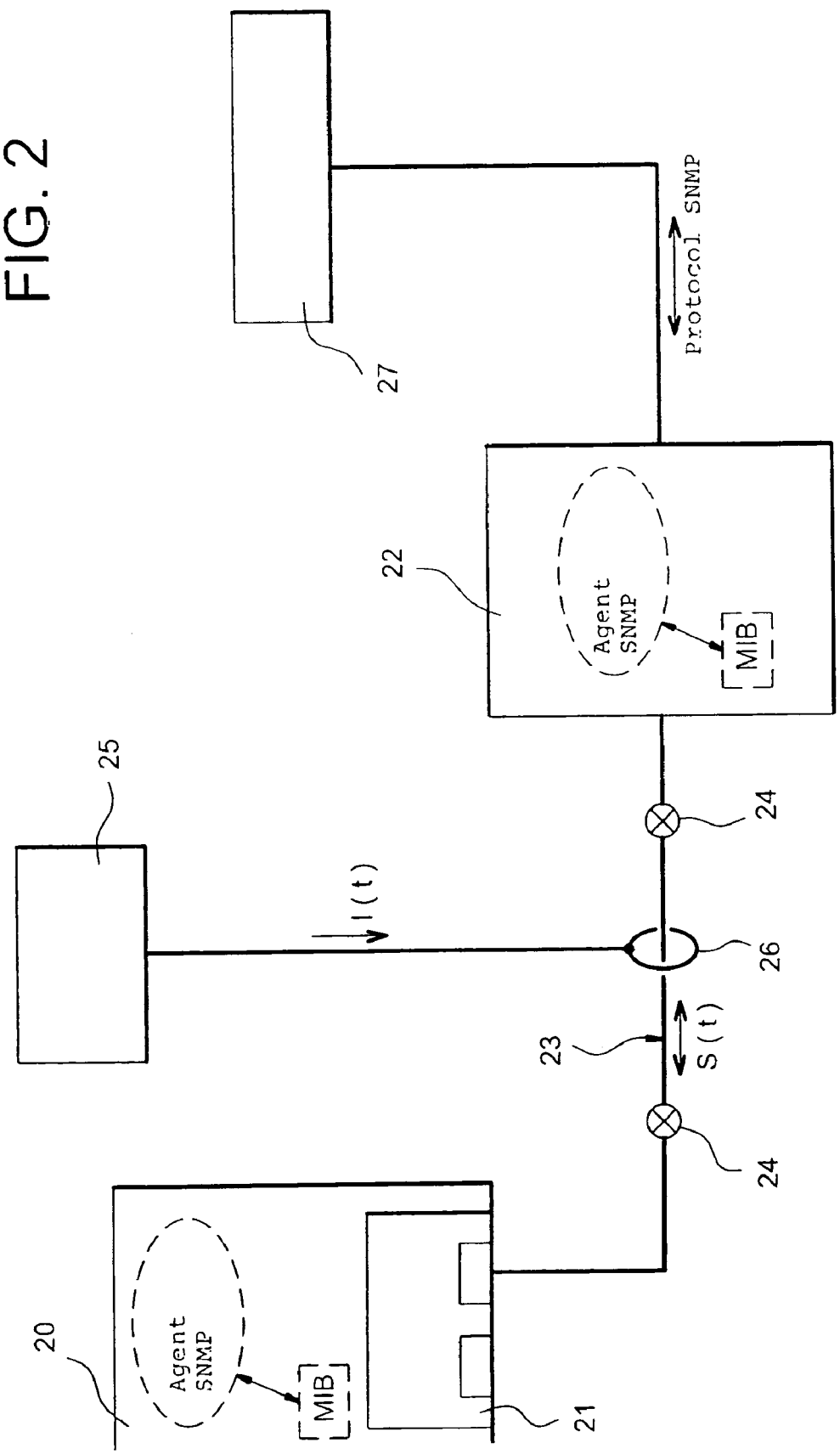

METHOD FOR DETECTION OF A SHIELDING FAULT IN A MULTIWIRE CABLE

CROSS-REFERENCE TO RELATED APPLICATION

This application claims priority to French application No. 02 12671, filed on Oct. 11, 2002, entitled: "Method For Detection of a Shielding Fault in a Multiwire Cable" and was not published in English.

TECHNICAL DOMAIN

This invention relates a method for detecting a shielding fault in a multiwire cable, usable particularly on an aircraft.

STATE OF PRIOR ART

Communication networks (Ethernet, ATM, etc.) using links preferably made of copper are sensitive to electromagnetic aggression and are limited in terms of electromagnetic radiation.

Shielded connections are used to solve this type of problem. But, it is often difficult and expensive to check the integrity of the shielding of such links.

Document reference [1] at the end of this description describes a reflectometric method known in prior art for checking the integrity of the shielding of a cable, and this method is applied to a pair of conductors in this cable. This method gives inaccurate results when only the shielding is damaged.

Document reference [2] describes a method of checking the integrity of the shielding of a cable based on a measurement of the transfer impedance. This is by far the most frequently used method. It has the disadvantage that it uses large equipment and requires many implementation precautions. It also requires that the voltage of a conductor should be measured in the cable, which usually means that the installation has to be modified accordingly.

Document reference [3] describes a loop resistance test sensor to monitor the integrity of cable shielding. This sensor uses a control current probe with two windings, one of these windings being used to measure a voltage injected on the said shielding. In the case of a test on an aircraft wiring system, the electrical cable and the structure of the aircraft in which it is fixed form a continuous loop through which a current can circulate. An alternating electrical voltage is induced in this loop using the said sensor, and the loop current is measured by the sensor. The complex ratio of the current induced in the loop to the loop voltage gives the loop impedance, and the real resistive part of this impedance provides information about the integrity of the electrical shielding and its connection to the aircraft structure.

This type of sensor is not sufficiently precise for Ethernet applications (high frequency). This sensor could be incapable of detecting a very small increase in the loop resistance, even though this increase could have a significant influence on the protection quality of the shielding. The said very small increase in the loop resistance can occur in particular in the case of a very long cable with a high loop resistance and if the said shielding is damaged. Furthermore, this type of sensor cannot be used for dynamic measurements since in this case the current corresponding to the data transfer in this cable would disturb the measurement.

The purpose of the invention is to provide better precision for the detection of a shielding fault in a multiwire cable and to simplify and enable a simplified dynamic measurement.

PRESENTATION OF THE INVENTION

Consequently, this invention proposes a method for detection of a shielding fault in a multiwire cable forming part of a communication network, during functional operation of the said network, the said cable transferring a multiframe signal S(t) and characterized in that it comprises the following steps:

a disturbing signal I(t) is injected into the said cable through an injection clamp, which is in a magnetic loop that may be opened or closed around the cable and in which an alternating signal is injected for a determined time T, when an item of equipment receives the signal S(t), the number N of frames in fault during the injection period of the disturbing signal I(t) is counted, it is decided that there is a shielding fault in this cable if $N/T \leq TEP_{max}$, where $TEP_{max}$ is the maximum packet error rate to be guaranteed.

$TEP_{max}$ may be equal to 0. The communication network may be an Ethernet network. The number N may be the number of error frames, that in particular includes CRC errors, frames that are too short, and missing frames. The number N may also be included in the MIB part for different network equipment.

Advantageously, the following relation is true:

$$\frac{I1}{ATT_{min}} < I < \frac{I1}{ATT_{max}},$$

where:

I1: the level of the disturbing signal I(t) that disturbs the signal S(t) if there is no shielding protection, $ATT_{min}$: the minimum attenuation of the shielding necessary for the disturbance induced under the shielding to be less than I1, taking account of the expected maximum external aggression, $ATT_{max}$: normal attenuation of the shielding.

The disturbing signal I(t) may be similar to the signal S(t) transferred on the cable. It may also have at least one frequency previously identified as particularly disturbing the signal S(t).

In particular, the method according to the invention can be used on an aircraft.

BRIEF DESCRIPTION OF THE DRAWINGS

FIG. 2 illustrates an example embodiment of the invention.

DETAILED PRESENTATION OF PARTICULAR EMBODIMENTS

Figure 1:
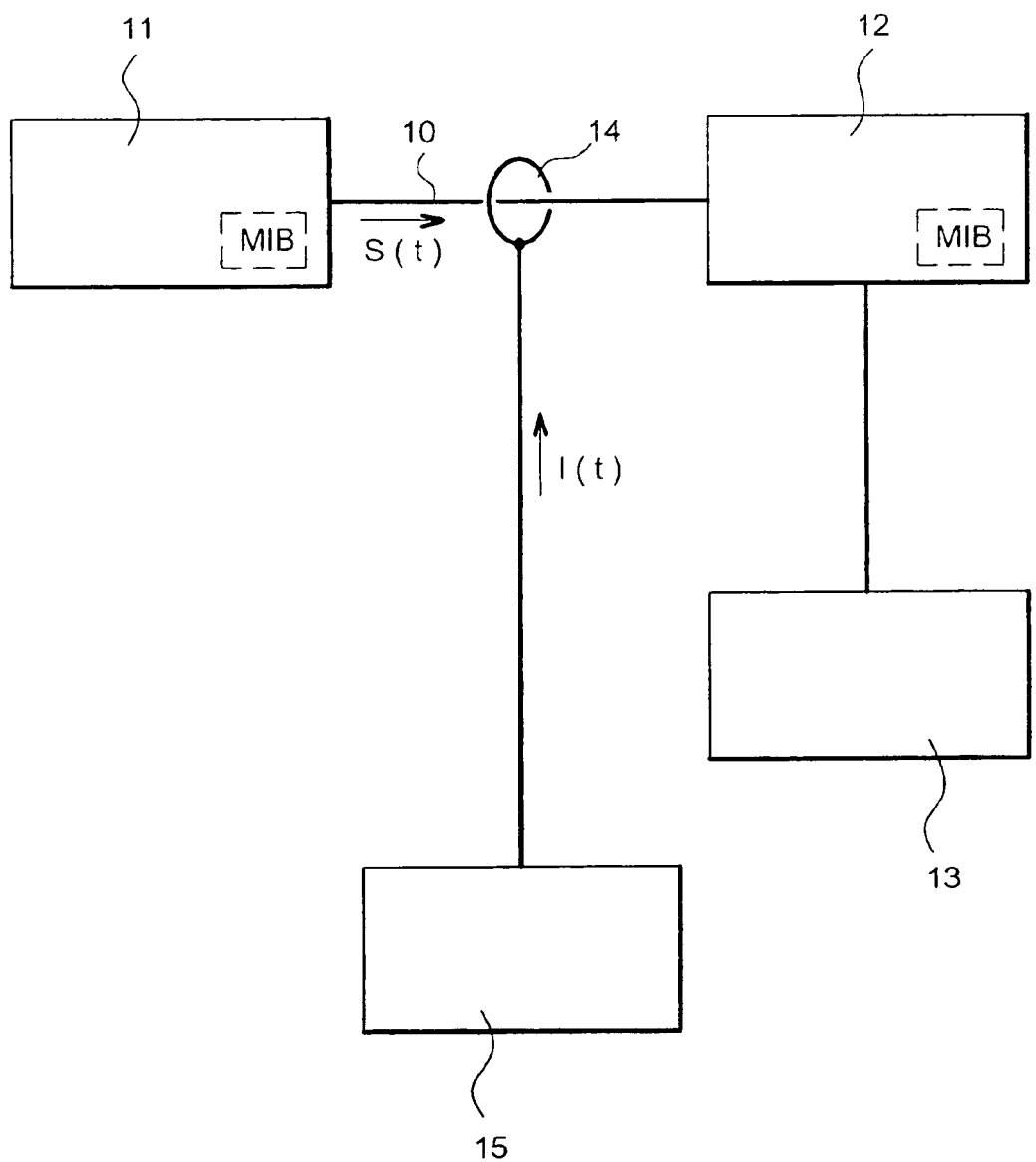
FIG. 1 illustrates the principle diagram for an installation using the method according to the invention.

The method according to the invention proposes to use the sensitivity of multiframe signals S(t) transferred in a multiwire cable of a communication network, during functional operation of this network.

This method comprises the following steps:

a disturbing signal I(t) is injected into the said cable through an injection clamp for a determined time T, when an item of equipment receives this signal, the number N of frames in fault during the injection period of the disturbing signal is counted, it is decided that there is a problem in the shielding of this cable if $N/T \leq TEP_{max}$, where $TEP_{max}$ is the maximum packet error rate to be guaranteed, which may be equal to zero.

FIG. 1 illustrates the principle diagram of an installation, for example an aircraft, that uses this method. The signal S(t) is transferred on a multiwire cable 10 between a subscriber equipment 11 and an interface 12 to which a control terminal 13 is connected. An injection clamp 14 is used to inject a signal I(t) output from a generator 15 into the cable 10. The terminal 13 checks the number of frames lost during the injection period of the disturbing signal.

The N frames in fault during the injection may be counted in different ways.

This count may be based on a count of the number of frames in error, particularly including CRC (Cyclic Redundancy Check) errors, frames too short, and missing frames.

For an Ethernet type communication network, this number N is usually naturally counted in the MIB (Management Information Base) part of the subscriber equipment 11 or the interface 12. The control terminal 13 simply displays information from the MIB part of the equipment 12.

The amplitude I of the disturbing signal I(t) is chosen such that:

the transmission protocol based on the signal S(t) transferred on the cable 10 is disturbed, and frame losses are detected in reception, if the shielding of this cable 10 is damaged, this transmission protocol is not disturbed if the shielding of this cable 10 is undamaged.

The following values are considered:

I1: the level of the disturbing signal I(t) that disturbs the signal S(t) if there is no shielding protection, $ATT_{min}$: the minimum shielding attenuation necessary so that the disturbance induced under the shielding is less than I1, considering the maximum external aggression achieved, which is specified by international standards, $ATT_{max}$: normal attenuation of the shielding.

The shielding of the cable 10 is considered as being degraded when its attenuation is between $ATT_{min}$ and $ATT_{max}$. Considering the following relations:

I.$ATT_{max}$<I1: no disturbance if the shielding is undamaged,

I.$ATT_{min}$>I1: deterioration of the shielding induces a loss of frames, we then get:

$$\frac{I1}{ATT_{min}} < I < \frac{I1}{ATT_{max}}$$

The disturbing signal I(t) may be in different forms:

It may be similar to the signal S(t) transferred on the cable 10. For example, this may be an Ethernet signal I(t) at 100 Mbits/second, like the signal S(t).

It may be at one or several frequencies, which may have been previously identified as particularly disturbing the signal S(t). These frequencies are usually located at the maximum spectral density of the signal S(t), for example at 31.25 MHz for an Ethernet signal S(t) at 100 Mbits/second.

FIG. 2 illustrates an example embodiment for detection of a fault on a link in the AFDX (Avionics Full Duplex Ethernet) network.

This figure shows:

an AFDX subscriber equipment 20, with an AFDX end system 21, an AFDX switch 22, a shielded "star quad" cable 23 connecting this system 21 and this switch 22, connectors 24 based on "Quadrax" contacts placed on this shielded cable 23, a current generator 25 connected to a calibrated injection clamp 26 placed around this cable 23, a network manager 27 in liaison with the switch 22 using an SNMP (Simple Network Management Protocol) protocol.

The SNMP protocol enables the network manager 27 to know the state of subscriber equipment 20 on the network. The SNMP agent is a software module in an item of equipment (equipment 20 or switch 22) that answers queries from the manager 27. It uses the MIB database to respond to these queries.

The following signals are shown on this figure.

S(t): AFDX signal (Ethernet full duplex 100 Mbit/s)

I(t): sinusoidal disturbing signal at 31.25 MHz with an amplitude of 300 mA (in this case it is assumed that the injection ratio is equal to 1)

I1=15 mA, ATTmin=0.1, ATTmax=0.05

T: 2 seconds.

The network manager 27 recovers the afdxMACCRerrors object (number of frames in CRC error) in the MIB parts of the AFDX switch 22 and the AFDX subscriber 20 through the SNMP protocol.

The link is considered to be fault free if no errors occur either at the subscriber end 20 or the AFDX switch end 22.

REFERENCES

[1] "High Accuracy Location of Faults on Electrical Lines Using Digital Signal Processing" by Leo P. Van Biesen, J. Renneboog (IEEE Transaction on Instrumentation and Measurement. Vol. 39, No. 1, February 1990).

[2] "Fault detection techniques for complex cable shield topologies" by Kurt H. Coonrod (September 1994, Philips Laboratory, ref. PL-TR-93-1111).

[3] EP 0 936 469.

What is claimed is:

1. Method for detection of a shielding fault in a multiwire cable forming part of a communication network, during functional operation of the said network, the said cable (10) transferring a multiframe signal S(t), characterized in that it comprises the following steps:

a disturbing signal I(t) is injected into the said cable through an injection clamp (14) for a determined time T;

when an item of equipment (12) receives the signal S(t), the number N of frames in fault during the injection period of the disturbing signal I(t) is counted; and it is decided that there is a shielding fault in this cable if $N/T \leq TEP_{max}$, where $TEP_{max}$ is the maximum packet error rate to be guaranteed.

2. Method according to claim 1, in which $TEP_{max}$ is equal to 0.

3. Method according to claim 1, in which the communication network is an Ethernet network.

4. Method according to claim 1, in which N is the number of error frames, that in particular includes CRC errors, frames that are too short, and missing frames.

5. Method according to claim 1, in which the number N is included in the MIB part for different network equipment (11, 12).

6. Method according to claim 1, in which the following relation is true:

$$\frac{I1}{ATT_{min}} < I < \frac{I1}{ATT_{max}},$$

where:
- $I1$: the level of the disturbing signal I(t) that disturbs the signal S(t) if there is no shielding protection;
- $ATT_{min}$: the minimum attenuation of the shielding necessary for the disturbance induced under the shielding to be less than I1, taking account of the expected maximum external aggression; and
- $ATT_{max}$: normal attenuation of the shielding.

7. Method according to claim 1, in which the disturbing signal I(t) is similar to the signal S(t) transferred on the cable.

8. Method according to claim 1, in which the disturbing signal I(t) has at least one frequency previously identified as particularly disturbing the signal S(t).

* * * * *